United States Patent
Ambühl et al.

(10) Patent No.: US 11,016,522 B2
(45) Date of Patent: May 25, 2021

(54) WAVEFORM GENERATION

(71) Applicant: Nordic Semiconductor ASA, Trondheim (NO)

(72) Inventors: Rolf Ambühl, Trondheim (NO); Vemund Kval Bakken, Trondheim (NO); Fredrik Jakobsen Fagerheim, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 86 days.

(21) Appl. No.: 15/736,766

(22) PCT Filed: Jun. 16, 2016

(86) PCT No.: PCT/GB2016/051797
§ 371 (c)(1),
(2) Date: Dec. 14, 2017

(87) PCT Pub. No.: WO2016/203242
PCT Pub. Date: Dec. 22, 2016

(65) Prior Publication Data
US 2018/0188767 A1     Jul. 5, 2018

(30) Foreign Application Priority Data
Jun. 16, 2015   (GB) ..................... 1510604

(51) Int. Cl.
*G06F 7/00* (2006.01)
*G06F 1/025* (2006.01)
(Continued)

(52) U.S. Cl.
CPC .............. *G06F 1/025* (2013.01); *G06F 1/022* (2013.01); *G06F 3/0628* (2013.01); *H03K 7/08* (2013.01)

(58) Field of Classification Search
CPC ....................................................... G06F 1/025
See application file for complete search history.

(56) References Cited

U.S. PATENT DOCUMENTS

| 4,222,108 A | 9/1980 | Braaten |
| 4,881,040 A | 11/1989 | Vaughn |

(Continued)

FOREIGN PATENT DOCUMENTS

| CN | 1353503 A | 6/2002 |
| CN | 2678250 Y | 2/2005 |

(Continued)

OTHER PUBLICATIONS

International Search Report and Written Opinion for PCT/GB2016/051797, dated Sep. 25, 2016, 11 pages.
(Continued)

*Primary Examiner* — Mohammed H Rehman
(74) *Attorney, Agent, or Firm* — Klarquist Sparkman, LLP

(57) ABSTRACT

A digital microprocessor device (2) has: a central processing unit; a memory (8); and an output signal module (4). The output signal module comprises: a counter (6) arranged to count to a predetermined count value; and at least one comparator (10a, 10b, 10c) arranged to change an output signal (14a, 14b, 14c) from a first output state to a second output state when the counter reaches a predetermined comparator value. The output signal module is arranged to load automatically from the memory at least one parameter selected from the group comprising: the predetermined count value, the predetermined comparator value and the first output state or the second output state, without receipt of an instruction from the central processing unit.

13 Claims, 5 Drawing Sheets

(51) Int. Cl.
*H03K 7/08* (2006.01)
*G06F 3/06* (2006.01)
*G06F 1/02* (2006.01)

(56) References Cited

U.S. PATENT DOCUMENTS

| | | | |
|---|---|---|---|
| 5,432,293 A | | 7/1995 | Nonaka et al. |
| 5,499,177 A | | 3/1996 | Ichihara |
| 5,627,500 A | | 5/1997 | Wolaver et al. |
| 7,000,123 B2* | | 2/2006 | Mariaud ............. G06F 13/4068 |
| | | | 710/15 |
| 8,117,482 B2* | | 2/2012 | Takata .................... H03K 7/08 |
| | | | 713/500 |
| 8,675,374 B2* | | 3/2014 | Coleman ............. H02M 3/1582 |
| | | | 363/21.03 |
| 2002/0180546 A1 | | 12/2002 | Onde |
| 2007/0300113 A1* | | 12/2007 | Boerstler ......... G01R 31/31727 |
| | | | 714/733 |
| 2009/0292936 A1 | | 11/2009 | Hayakawa et al. |
| 2010/0306570 A1* | | 12/2010 | Uchida ..................... G06F 1/12 |
| | | | 713/600 |
| 2012/0084589 A1* | | 4/2012 | Millet ................... G06F 1/3203 |
| | | | 713/323 |
| 2013/0246818 A1* | | 9/2013 | Nomura ................ G06F 1/3225 |
| | | | 713/320 |

FOREIGN PATENT DOCUMENTS

| | | |
|---|---|---|
| CN | 103959268 A | 7/2014 |
| EP | 2 020 629 A2 | 2/2009 |
| JP | 2005116399 A | 4/2005 |

OTHER PUBLICATIONS

Search Report under Section 17(5) for GB1510604.0, dated Nov. 24, 2015, 3 pages.

* cited by examiner

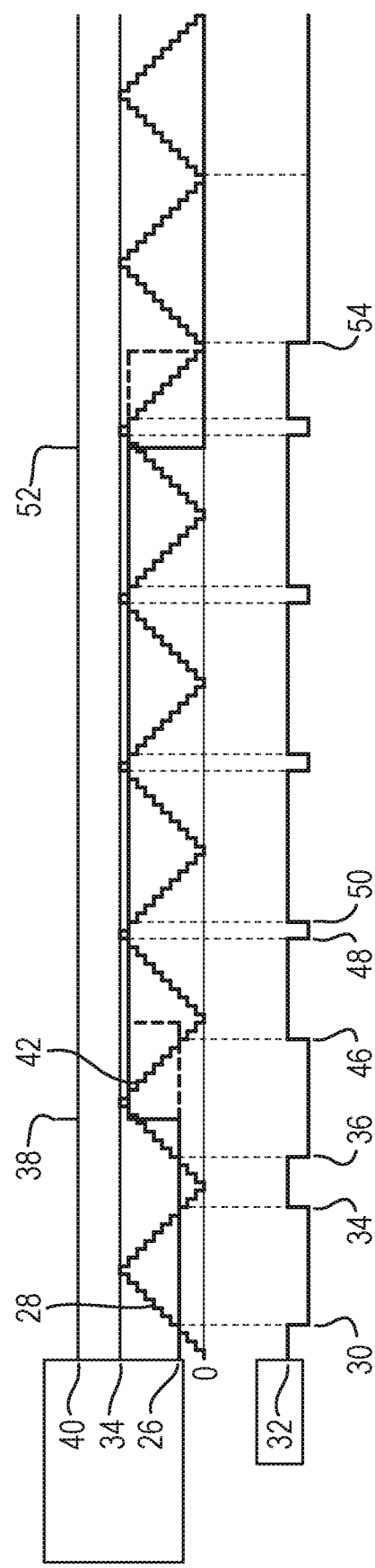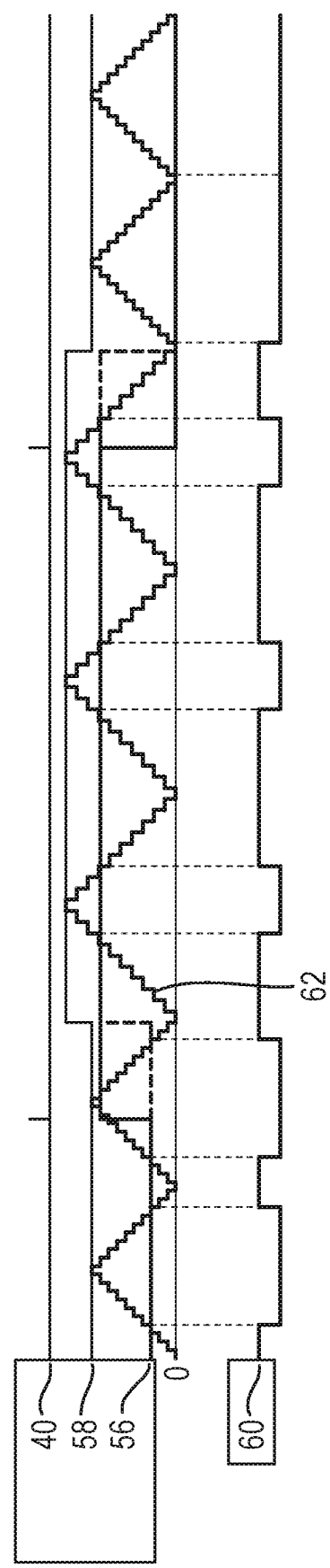

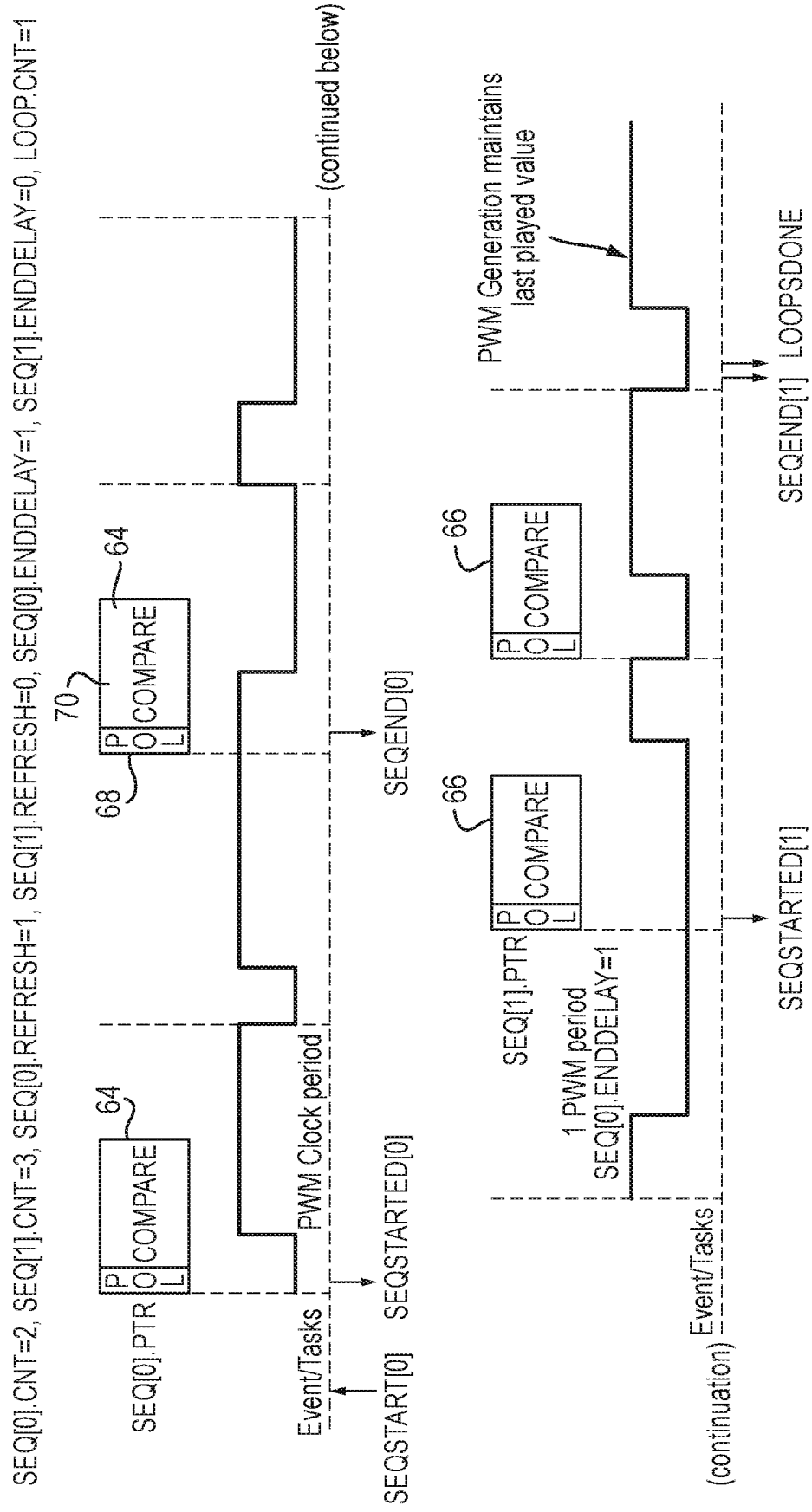

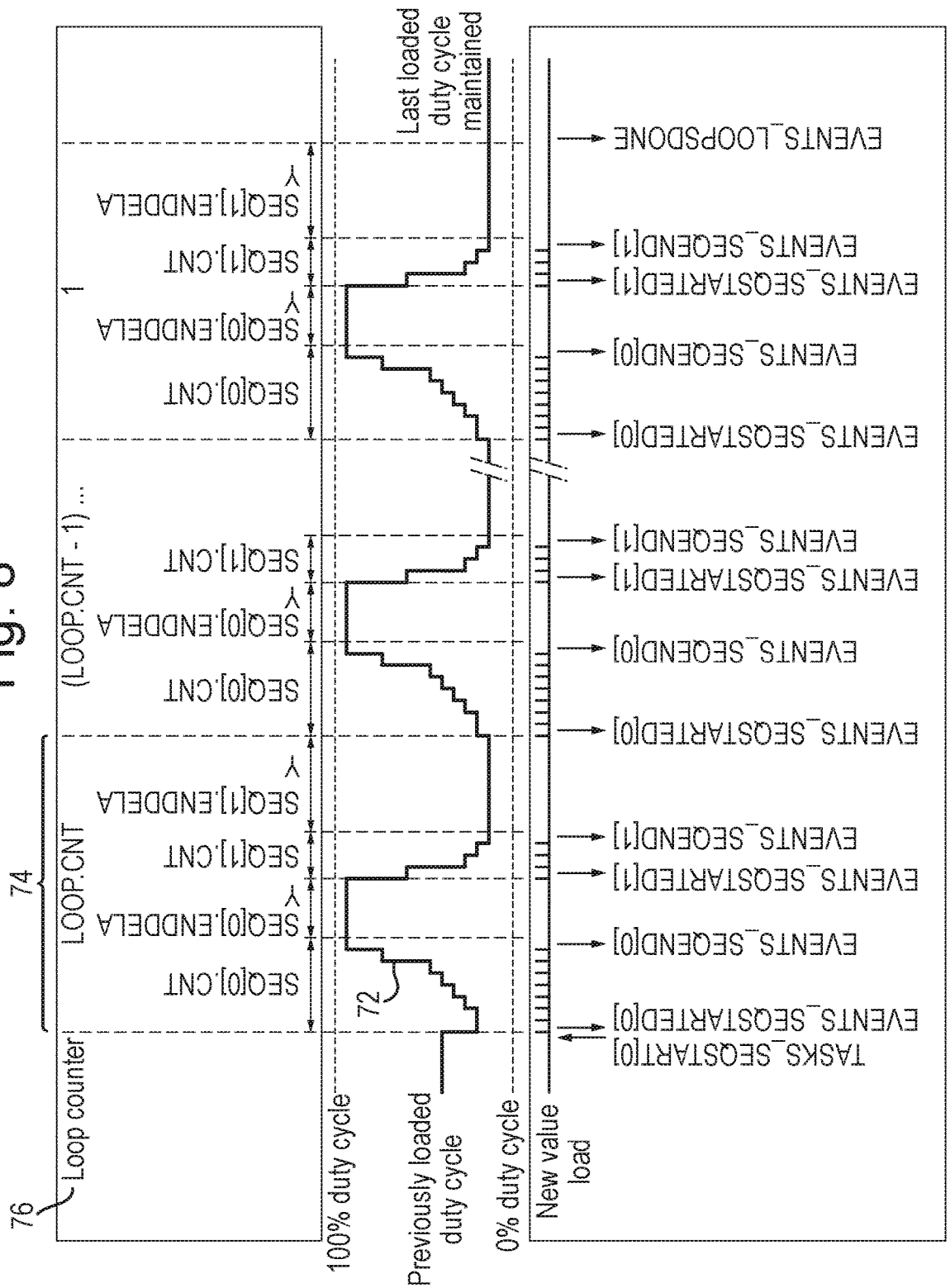

WAVEFORM GENERATION

CROSS REFERENCE TO RELATED APPLICATIONS

This is the U.S. National Stage of International Application No. PCT/GB2016/051797, filed Jun. 16, 2016, which was published in English under PCT Article 21(2), which in turn claims the benefit of Great Britain Application No. 1510604.0, filed Jun. 16, 2015.

This invention relates to the use of a microprocessor to generate a predetermined waveform It relates specifically to the use of Pulse Width Modulation (PWM) to generate such waveforms.

PWM modules are usually present in micro-controller units (MCUs) in order to allow the generation of output waveforms that can be used to drive external accessories such as lights, motors, loudspeakers etc. These typically comprise timers with specific modes and compare functions. These are controlled by software running on the MCU. This means that whenever it is necessary to change the settings of the PWM module dynamically, a central processing unit (CPU) must load a set of registers sequentially. Significant power consumption is incurred when the CPU is running and the slow nature of the memory-mapped interface makes it difficult to meet real-time requirements. The result is high power usage and a limitation as to the patterns that can be generated.

When viewed from a first aspect the invention provides a digital microprocessor device having:
  a central processing unit;
  a memory; and
  an output signal module, comprising:
    a counter arranged to count to a predetermined count value; and
    at least one comparator arranged to change an output signal from a first output state to a second output state when said counter reaches a predetermined comparator value;
  wherein said output signal module is arranged to load automatically from said memory at least one parameter selected from the group comprising: said predetermined count value, said predetermined comparator value and said first output state or said second output state, without receipt of an instruction from said central processing unit.

Thus it will be seen by those skilled in the art that in accordance with the invention one or more characteristics of the signal produced by the output signal module can be altered automatically without requiring intervention by the CPU and therefore without requiring the CPU to be powered up from a dormant state. This has the potential to save a significant amount of power. On the other hand it provides significant flexibility in the signals which can be produced. For example where, as is preferred, the counter operates at a fixed rate, the predetermined count value will determine the period of the output signal. The predetermined comparator value will determine what proportion of the cycle the output will be in the first or second output state respectively; in other words it determines the duty cycle of the output. Furthermore the device specified in accordance with the invention allows, in at least embodiments thereof, sequences of different outputs to be constructed by changing the parameters. These sequences can then be repeated (i.e. looped) or executed sequentially to build up more complex outputs.

The counter may, in some embodiments, be arranged to return immediately to an initial value upon reaching the predetermined count value. It will be appreciated of course that the counter could be arranged to count up or down so the predetermined count value could represent a maximum or a minimum. In other embodiments upon reaching the predetermined count value it may be arranged to count in the opposite direction towards the initial value.

The first and second output states determine the polarity of the output. For example if the first state is low and the second state is high the output will change from low to high when the predetermined comparator value is reached and will stay high until the counter value drops below the predetermined comparator value again—which may occur when the counter returns to zero (or other initial value) or when the count has reached the predetermined count in the other direction. If the first state is high and the second state is low, an inverted version of such a signal will be obtained. Since the first and second output states are complements of one another they may be determined by a single parameter, referred to hereinafter as polarity.

A single comparator may be provided, giving a single output. In a set of embodiments however a plurality of comparators is provided with respective predetermined comparator values and providing respective output signals. The output signals could be used independently or could be combined. This provides the ability in some embodiments to generate a composite output signal having a complex pattern.

Preferably the comparators use the same counter as this minimises the physical area required on the circuit and minimises power usage. The predetermined count value will therefore be common in such embodiments. Preferably, however, values for one or both of the predetermined comparator value or the polarity are loaded from the memory for each of the respective comparators. It will be appreciated that where the counter is unidirectional (returning immediately to its initial value after the predetermined count value is reached), the edges of the pulses in the respective output signals will be aligned with one another since the comparators will all revert to the first state at the same time. Where the counter is bidirectional, the respective output signals will have pulses whose centres are aligned (with the time when the predetermined count value is reached and the count changes direction).

In a set of embodiments the device is arranged such that the parameter(s) may be loaded from the memory in every cycle. As used herein a cycle is defined as the time between successive instances of the counter reaching the predetermined count value. Since the predetermined count value can itself be changed, it follows that the period of the cycle is variable. The ability to change the parameters pertaining to the output signals on a 'per pulse' basis without having to power up the CPU gives a particularly advantageous arrangement. In embodiments of the invention sequences can be repeated a number of times, concatenated or looped, with variable delays between them simply by storing appropriate data in the memory. This gives the ability therefore to produce almost limitless repeating or non-repeating outputs. In a set of embodiments therefore the memory of the device comprises data corresponding to at least a first sequence portion, a second sequence portion and a delay between said first and second sequence portions, the device being arranged to execute said first sequence portion and then execute the second sequence portion after said delay.

The memory could be a dedicated memory but preferably it comprises random access memory (RAM) used by the CPU and, typically, other peripherals. In a set of embodiments the device comprises a further peripheral arranged to store a set of parameters into the memory. This allows, for example, a peripheral to generate an event which is routed to the output signal module which causes said at least one parameter to be loaded from the memory. The further peripheral may communicate with the output signal module via a Peripheral-Peripheral Interface (PPI) which is described in greater details in the Applicant's earlier application WO 2013/088121. This allows events to be generated in an asynchronous manner relative to the output signal module.

The device may be arranged so that parameters can be loaded at any point during a cycle. In a set of embodiments however it is arranged so that they are loaded at a specific point—e.g. when the predetermined count value is reached. This may assist in preventing glitches on the output.

Certain embodiments of the invention will now be described, by way of example only, with reference to the accompanying drawings in which:

FIG. 1 is a schematic representation of a typical system in accordance with the invention;

FIG. 2. Is an illustration of the operation of an embodiment of the invention having three output channels and a unidirectional counter;

FIG. 5 illustrates the effect on the output waveform of changing the comparator threshold;

FIG. 6 illustrates the effect on the output wave form of changing the maximum counter value;

FIG. 7 is an illustration of a combined sequence than can be produced in accordance with the invention; and FIG. 8 is an illustration of changes in duty cycle for a complex sequence.

Figure 1:
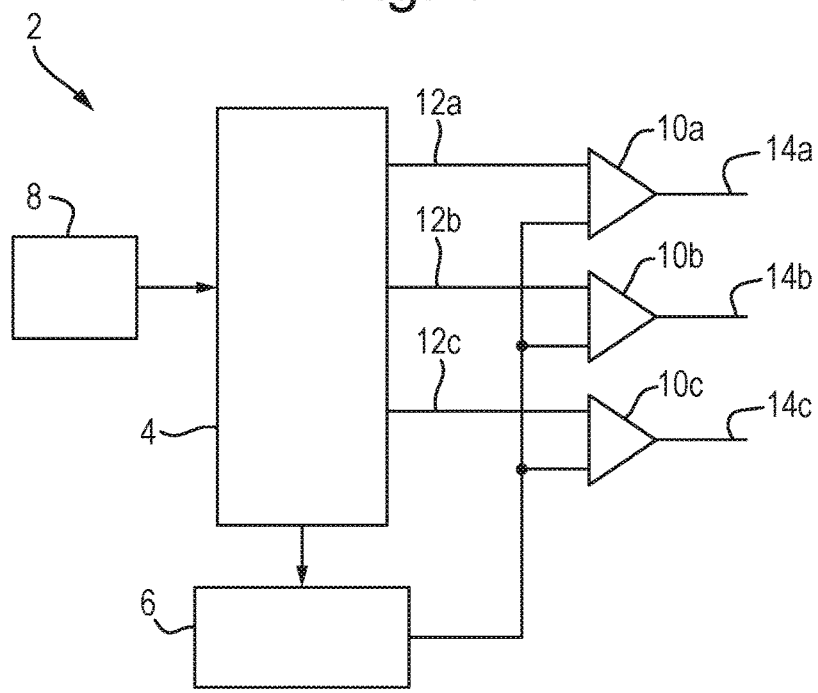

Turning first to FIG. 1 there may be seen a schematic representation of a typical output signal generator in accordance with the invention. This broadly comprises a decoder module 4, a counter 6, Random Access Memory (RAM) 8 and a set of comparators 10a, 10b, 10c. The comparators compare the output of the counter 6 to respective threshold values provided by the decoder module 4 on respective data lines 12a, 126, 12c. The data lines also provide respective polarity bits to the comparators 10a, 10b, 10c which determine whether the output 14a, 14b, 14c of a given comparator goes high or low when the count exceeds the threshold and vice versa. The outputs 14a, 14b, 14c of the comparators provide the output of the circuit—i.e. the required signals being generated. In this example there are three output channels but this is only illustrative and any convenient number, including a single channel, could be provided.

In use the decoder module 4 loads in data from the RAM 8. This includes values for the thresholds and polarities to be applied by the comparators 10a-c and the maximum value to which the counter 6 should count. The counter 6 increments its output by one every clock cycle (clock not shown) which is shown by the top trace 7 in FIG. 2. When the count 7 reaches the value COMP1 which is the threshold of the middle comparator 10b, the corresponding output 14b goes from high to low (this behaviour being determined by the polarity bit of the data packet received on the input 12b from the RAM 8 via the module 4). Similarly when the count 7 reaches the higher threshold COMP0 of the first comparator 10a, the corresponding output 14a goes low. Shortly after, the counter output 7 reaches the threshold COMP2 of the third comparator 10c, causing its output 14c to go low.

Once the counter output 7 reaches the maximum value COUNTERTOP, also set from the RAM 4, it returns to zero (or some other minimum value). This causes all the comparator outputs 14a-c to reset high.

Figure 2:
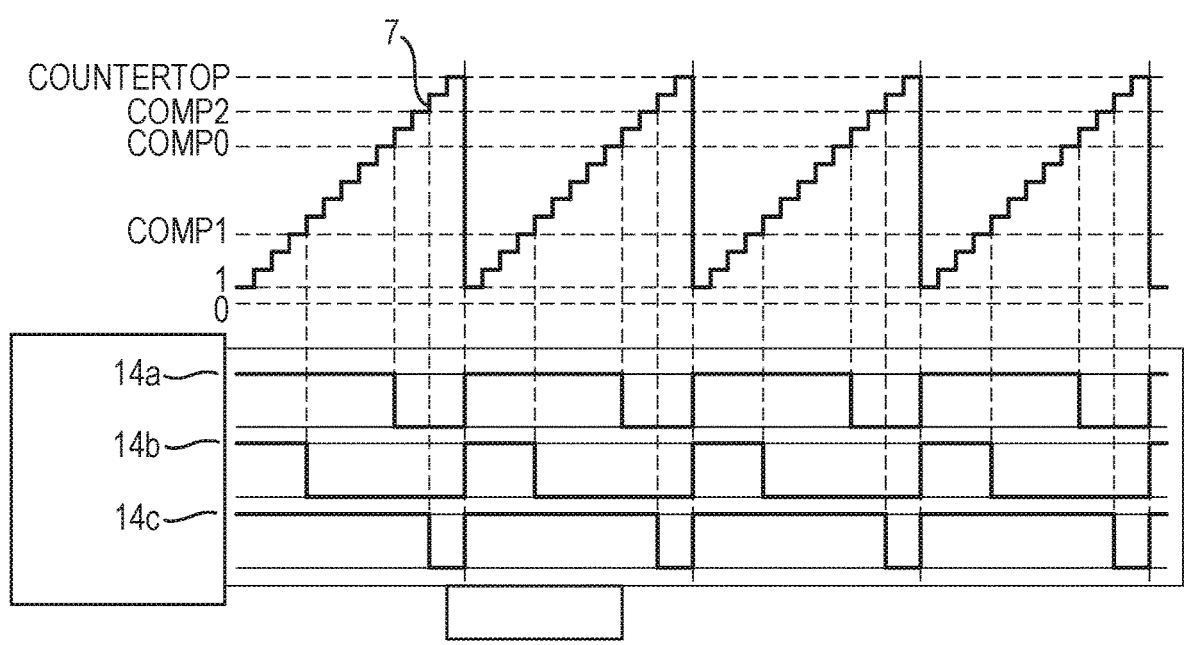

The resultant waveforms in the lower portion of FIG. 2 show that the duty cycles of the respective outputs 14a-c differ depending on the associated threshold value. The waveforms have edges aligned with the counter reset. Since no new values are loaded from the RAM 4 during the time period illustrated in FIG. 2, the waveforms are all regular. The outputs 14a-c could, for example be used to illuminate respective LEDs at different levels of brightness corresponding to their different duty cycles.

Figure 3:
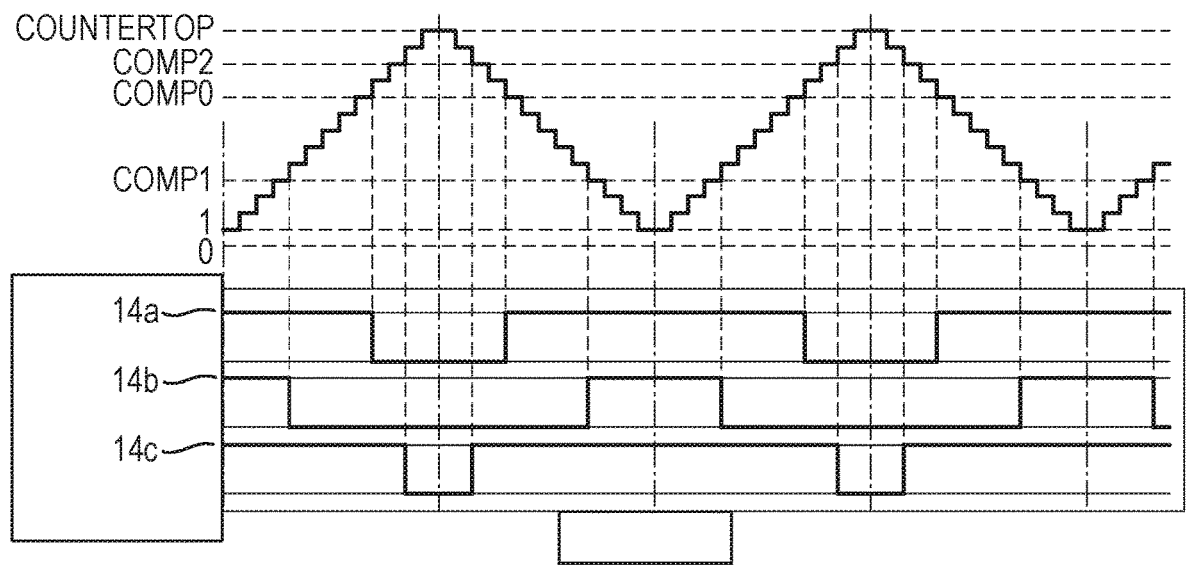
FIG. 3 is an illustration of the operation of an embodiment having three channels and a bidirectional counter.

FIG. 3 illustrates a similar arrangement. It differs in that the counter 6 is bi-directional—i.e. it is arranged to count back down again after it reaches the maximum level COUNTERTOP. The effect of this is that for the same threshold values COMP0, COMP1, COMP2 as in the previous example, the wavelengths of the output waveforms 14a-c are doubled and are now centre-aligned.

Figure 4:
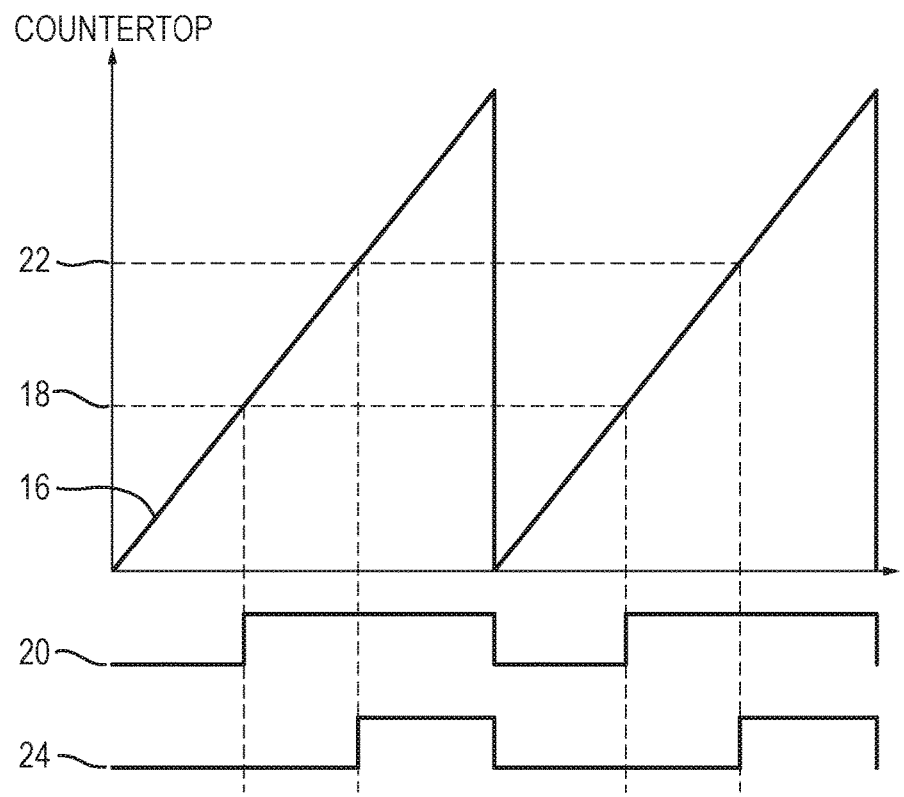
FIG. 4 is a graph showing the effect of reversing polarity.

FIG. 4 shows the effect of changing polarity. Here as the counter output 16 (shown for clarity as continuous rather than discrete) reaches the threshold value 18 of a first comparator, the corresponding output 20 goes high rather than low. Similarly as the counter output 16 reaches a second threshold value 22, the corresponding output 24 goes high. The result of this is that the two waveforms 20, 24 are inverted compared to what would have been produced using the same polarity that was used in FIGS. 2 and 3.

As previously mentioned, the waveforms of FIGS. 2 and 3 are produced when the values of the comparator thresholds and polarity, and the maximum counter value remain unchanged. Turning now to FIG. 5 however, the effect of changing the threshold of a comparator can be seen. Initially the threshold is set to a value 26 so that when the counter output 28 reaches this value 26 at time 30, the output 32 goes low. When the counter value 28 reaches the maximum 34, it begins to count down and thus when it crosses the threshold 26 in the opposite direction at time 34, the output 32 is caused to go high again. The beginning of this cycle is repeated at time 36 when the counter value 28 once more crosses the threshold 26 in the positive direction causing the output 32 to go low again at time 36.

Subsequently, at time 38 indicated by a pulse in a pattern clock 40, the threshold is raised to a higher value 42. It may be seen that if this value were to be applied immediately, the counter output 26 would almost immediately reach it, which gives rise to the risk of a glitch occurring in the output 32. Alternatively, therefore, the lower value 26 is maintained until the counter output 28 next reaches zero as indicated by the dashed line 44. This feature ensures that no glitch does occur in the output 32. Accordingly, the output 32 goes high at time 46 as dictated by the previous threshold value 26. As the newer threshold value 42 is significantly higher than the old threshold value 26, the counter 28 takes longer to reach it and therefore the output 32 remains high for a longer period of time—until time 48. Correspondingly, the output 32 remains low only for a short period until the counter output 28 has counted down to the new, higher threshold 42 at time 50.

This higher duty cycle output continues for two full cycles. When the next pulse 52 of the pattern clock 40 occurs, the threshold is changed again, in this case being reduced to zero. However, as before, the change is not implemented until the counter output 28 has next reached the zero level at time 54. Since the threshold is also zero, the output 32 goes low and remains low until a further change in the threshold occurs.

It can be seen therefore that by changing the threshold value dynamically, a relatively complex waveform 32 can be achieved. However, by ensuring that a change in threshold is not applied until a known point in the cycle (in this example when the counter reaches zero) glitch-free operation can be ensured.

FIG. 6 shows a similar arrangement except that as well as altering the threshold value 56, the maximum counter value 58 is also altered during the production of the output waveform 60. The maximum counter value 58 is altered in synchrony with actual implementation of the change in threshold value, i.e. when the counter output 62 reaches zero. The effect of the change in the maximum counter value 58 is to stretch the output cycles 60 compared those of the previous embodiment. This illustrates a further degree of freedom which can be employed to generate complex output waveforms in accordance with the invention.

FIG. 7 shows how a more complex sequence waveforms can be generated by using concatenated sequences in a loop. The loop comprises a first sequence SEQ[0] followed by a zero delay, then followed by a further sequence SEQ[1] followed by a delay of one cycle before returning to SEQ[0]. The two sequences SEQ[0] and SEQ[1] are defined with address of values tables in data RAM which are pointed to by respective pointers and which return data words 64, 66 for the respective sequences. The rate at which a new value is loaded is defined individually for each sequence by a parameter SEQ[n].REFRESH. A register, LOOP.CNT, determines after how many times the one cycle delay has been executed (indicating the end of the sequence) the playback stops and a LOOPDONE event is generated. The SEQ[0] data word 64 comprises an initial polarity bit 68 and then a further 15 bits 70 which define the threshold count level which the comparator should apply. The SEQ[1] data word 66 has the same format. This gives ample accuracy for all likely practical uses.

In the example shown in FIG. 7 the sequence SEQ[0] is defined with a parameter that means that a new PWM duty cycle is pushed every second PWM period. This complex sequence is started with the SEQSTART[0] task, so SEQ[0] is executed first. Since a parameter SEQ[0].ENDDELAY=1 there will be one PWM period delay between the last period on sequence SEQ[0] and the first period on sequence SEQ [1]. Since SEQ[1].ENDDELAY=0 however there is no delay after SEQ[1], such that SEQ[0] would be started immediately after the end of SEQ[1]. However, as LOOP.CNT is one, the playback stops after having executed SEQ[1] only once, and both SEQEND[1] and LOOPSDONE events are generated (their order is not guaranteed).

Finally FIG. 8, shows how the duty cycle 72 varies with time over the looped concatenated sequences shown in FIG. 7. The pattern of duty cycle variation is continued for each loop 74 as the loop counter 76 is counted down from its initial value LOOP.CNT to 1.

In an advantageous implementation of the invention, a sequence may be loaded from an event source that is asynchronous with respect to the counter using the Peripheral-Peripheral Interface (PPI) which is described in greater detail in WO 2013/088121. For example in the case of a dimmer for a light, every time a button is pressed a general purpose input/output (GPIO) event is generated and it is routed to a NEXTSTEP task associated with the decoder module 4. New parameters controlling the output are loaded form the RAM 8 and the brightness of an LED controlled by the output will change automatically without any CPU intervention.

As will be appreciated by those skilled in the art, the embodiments of the invention set out above give a highly useful and flexible method of producing complex output sequences by loading a small number of data values directly from RAM without having to use the CPU. The ability for example to change the duty cycle, polarity, and/or maximum counter value at each step is particularly beneficial in providing this flexibility. As the skilled person will appreciate, by avoiding having to use the CPU, significant power savings can be achieved without sacrificing this flexibility. It will of course be understood that the principles of the invention may be implemented in many different ways and the described embodiments are merely examples of these.

The invention claimed is:

1. A digital microprocessor device having:
    a central processing unit;
    a memory; and
    an output signal module, arranged to operate without using the central processing unit, the output signal module comprising:
        a counter arranged to count to a predetermined count value; and
        at least one comparator arranged to change an output signal from a first output state to a second output state when said counter reaches a predetermined comparator value;
    wherein said device has an operating cycle wherein the period of said operating cycle comprises a time between successive instances of the counter reaching the predetermined count value,
    wherein said output signal module is arranged to load automatically from said memory said predetermined count value without receipt of an instruction from said central processing unit;
    the device being arranged such that the predetermined count value can be changed in every cycle.

2. The device as claimed in claim 1, arranged to construct a sequence of different outputs.

3. The device as claimed in claim 2, arranged to repeat the sequence.

4. The device as claimed in claim 1, comprising a plurality of comparators.

5. The device as claimed in claim 4, arranged to generate a composite output signal using outputs from more than one of said comparators.

6. The device as claimed in claim 4, wherein the plurality of comparators are arranged to use said counter.

7. The device as claimed in claim 4, arranged such that values for one or both of the predetermined comparator value or a polarity of the output signal are loaded from the memory for each of the respective comparators.

8. The device as claimed in claim 1, wherein the memory comprises data corresponding to at least a first sequence portion, a second sequence portion and a delay between said first and second sequence portions, the device being arranged to execute said first sequence portion and then execute the second sequence portion after said delay.

9. The device as claimed in claim 1, wherein the memory comprises random access memory (RAM) used by the central processing unit.

10. The device as claimed in claim 1, comprising a further peripheral arranged to store a set of parameters into the memory.

11. The device as claimed in claim 10, wherein the further peripheral is arranged to communicate with the output signal module via a Peripheral-Peripheral Interface (PPI).

12. The device as claimed in claim 1, arranged such that the parameter(s) are loaded when a specific count value is reached.

13. The device as claimed in claim 12 wherein the specific count value is the predetermined count value.

\* \* \* \* \*